(12) United States Patent
Huang et al.

(10) Patent No.: US 9,917,255 B2
(45) Date of Patent: Mar. 13, 2018

(54) METHODS OF MAKING COMPOSITE OF GRAPHENE OXIDE AND NANOSTRUCTURES

(71) Applicant: Northwestern University, Evanston, IL (US)

(72) Inventors: Jiaxing Huang, Wilmette, IL (US); Jaemyung Kim, Evanston, IL (US); Vincent C. Tung, Evanston, IL (US)

(73) Assignee: NORTHWESTERN UNIVERSITY, Evanston, IL (US)

( * ) Notice: Subject to any disclaimer, the term of this patent is extended or adjusted under 35 U.S.C. 154(b) by 38 days.

(21) Appl. No.: 13/758,183

(22) Filed: Feb. 4, 2013

(65) Prior Publication Data
US 2013/0199605 A1   Aug. 8, 2013

Related U.S. Application Data

(60) Provisional application No. 61/594,512, filed on Feb. 3, 2012.

(51) Int. Cl.
| | |
|---|---|
| *B82Y 30/00* | (2011.01) |
| *H01L 51/00* | (2006.01) |
| *H01L 51/42* | (2006.01) |
| *B82Y 10/00* | (2011.01) |
| *C23C 18/12* | (2006.01) |

(Continued)

(52) U.S. Cl.
CPC .......... *H01L 51/0048* (2013.01); *B82Y 10/00* (2013.01); *H01L 51/4213* (2013.01); *H01L 51/4253* (2013.01); *B05D 1/005* (2013.01); *B05D 5/12* (2013.01); *C23C 18/1262* (2013.01); *C23C 18/1295* (2013.01); *H01L 51/0003* (2013.01); *H01L 51/0036* (2013.01); *H01L 51/0049* (2013.01); *H01L 51/444* (2013.01);

(Continued)

(58) Field of Classification Search
CPC ... C23C 18/1262; C23C 18/1295; B05D 5/12; B05D 1/005; B05D 3/02
USPC .......... 427/74, 122, 240, 241, 383.1
See application file for complete search history.

(56) References Cited

U.S. PATENT DOCUMENTS 7,785,557 B2 *  8/2010  Gruner et al. ............ 423/445 R
7,796,123 B1 *  9/2010  Irvin et al. .................... 345/173

(Continued)

OTHER PUBLICATIONS

Tung et al. "Surfactant-Free Water-Processable Photconductive All-Carbon Composite", Journal of American Chemical Society, 2011, vol. 133, pp. 4940-4947.*

(Continued)

*Primary Examiner* — Brian K Talbot
(74) *Attorney, Agent, or Firm* — Locke Lord LLP; Tim Tingkang Xia, Esq.

(57) ABSTRACT

A method of forming a graphene oxide based layer includes preparing a dispersion of graphene oxide and nanostructures, and spin coating the dispersion on a surface of a substrate to form a spin coated film thereon; and thermally annealing the spin coated film to form the graphene oxide based layer, where the mass ratio of the graphene oxide and the nanostructures in the graphene oxide based layer is in a range of about 1:0.01 w/w to 1:0.8 w/w. The nanostructures are functionalized with carboxylic acid. The nanostructures include carbon nanotubes, or nanofibers. The carbon nanotubes include single walled carbon nanotubes (SWCNTs) or multi-walled carbon nanotubes (MWCNTs).

8 Claims, 5 Drawing Sheets

(51) Int. Cl.
    *B05D 5/12*  (2006.01)
    *B05D 1/00*  (2006.01)
    *H01L 51/44* (2006.01)
(52) U.S. Cl.
    CPC ....... *H01L 2251/308* (2013.01); *Y02E 10/549* (2013.01); *Y02P 70/521* (2015.11)

(56) References Cited

U.S. PATENT DOCUMENTS

| | | | | |
|---|---|---|---|---|
| 8,018,563 | B2* | 9/2011 | Jones | B82Y 10/00 |
| | | | | 252/500 |
| 8,182,917 | B2* | 5/2012 | Robinson | B82Y 20/00 |
| | | | | 252/378 R |
| 9,136,536 | B2* | 9/2015 | Grigorian | H01M 4/0402 |
| 2010/0098877 | A1* | 4/2010 | Cooper | B01D 71/022 |
| | | | | 427/551 |
| 2011/0157772 | A1* | 6/2011 | Zhamu | B82Y 30/00 |
| | | | | 361/502 |
| 2011/0210282 | A1* | 9/2011 | Foley | B82Y 25/00 |
| | | | | 252/62.51 R |
| 2012/0255607 | A1* | 10/2012 | Roy-Mayhew | H01G 9/2031 |
| | | | | 136/256 |
| 2012/0289613 | A1* | 11/2012 | Huang | A61K 9/10 |
| | | | | 514/784 |
| 2013/0040229 | A1* | 2/2013 | Grigorian | H01M 4/0402 |
| | | | | 429/532 |
| 2013/0116114 | A1* | 5/2013 | Nguyen | B82Y 30/00 |
| | | | | 502/159 |
| 2013/0130037 | A1* | 5/2013 | Bol | H01L 51/0048 |
| | | | | 428/408 |

OTHER PUBLICATIONS

Tung et al. "Low-Temperature Solution Processing of Graphene-Carbon Nanotube Hybrid Materials for High Performance Transparent Conductors", Nano Letters, vol. 9, No. 5, 2009, pp. 1949-1955.*
Tung et al. "Surfactant-Free water-processable Photconductive ALL-carbon composite", Journal of the American Chemical Society, vol. 133, 2011 pp. 4940-4947.*
Brabec et al., Organic photovoltaics: materials, device physics, and manufacturing technologies, 2008, Wiley-VCH, Weinheim.
Brabec et al., Polymer-Fullerene Bulk-Heterojunction Solar Cells, Adv. Mater., 2010, 3839-3856, 22.
Li et al., Solution-Processable Graphene Oxide as an Efficient Hole Transport Layer in Polymer Solar Cells, ACS Nano, 2010, 3169-3174, 4.
Compton et al., Graphene Oxide, Highly Reduced Graphene Oxide, and Graphene: Versatile Building Blocks for Carbon-Based Materials, Small, 2010, 711-723, 6.
Park et al., Chemical methods for the production of graphenes, Nature Nanotech., 2009, 217-224, 4.
Gao et al., Anode modification of inverted polymer solar cells using graphene oxide, Appl. Phys. Lett., 2010, 203306, 97.
Shin et al., Efficient Reduction of Graphite Oxide by Sodium Borohydride and Its Effect on Electrical Conductance, Adv. Funct. Mater., 2009, 1987-1992, 19.
Kim et al., Vertical ZnO nanowires/graphene hybrids for transparent and flexible field emission, J. Mater. Chem., 2011, 3432-34-37, 21.
Cote et al., Graphene oxide as surfactant sheets, Pure Appl. Chem., 2011, 95-110, 83.
Kim et al., Graphene Oxide Sheets at Interfaces, J. Am. Chem. Soc., 2010, 8180-8196, 132.
Tung et al., Surfactant-Free Water-Processable Photoconductive All-Carbon Composite, J. Am. Chem. Soc., 2011, 4940-4947, 133.
Chaudhary et al., Hierarchical Placement and Associated Optoelectronic Impact of Carbon Nanotubes in Polymer-Fullerene Solar Cells, Nano Lett., 2007, 1973-1979, 7.
Lee et al., Selective Electron- or Hole-Transport Enhancement in Bulk-Heterojunction Organic Solar Cells with N- or B-Doped Carbon Nanotubes, Adv. Mater., 2011, 629-633, 23.
Ameri et al., Organic tandem solar cells: A review, Energy Environ. Sci., 2009, 347-363, 2.
Tung et al., Sticky Interconnect for Solution-Processed Tandem Solar Cells, J. Am. Chem. Soc., 2011, 9262-9265, 133.

* cited by examiner

METHODS OF MAKING COMPOSITE OF GRAPHENE OXIDE AND NANOSTRUCTURES

CROSS-REFERENCE TO RELATED PATENT APPLICATIONS

This application claims priority to and the benefit of, pursuant to 35 U.S.C. § 119(e), U.S. provisional patent application Ser. No. 61/594,512, filed Feb. 3, 2012, entitled "WATER PROCESSABLE GRAPHENE OXIDE:SINGLE WALLED CARBON NANOTUBE COMPOSITE AND APPLICATIONS OF THE SAME," by Jiaxing Huang, Jaemyung Kim and Vincent C. Tung, which is incorporated herein in its entirety by reference.

STATEMENT AS TO RIGHTS UNDER FEDERALLY-SPONSORED RESEARCH

This invention was made with government support under grant number CMMI1130407 awarded by the National Science Foundation. The government has certain rights in the invention.

Some references, which may include patents, patent applications and various publications, are cited and discussed in the description of this invention. The citation and/or discussion of such references is provided merely to clarify the description of the present invention and is not an admission that any such reference is "prior art" to the invention described herein. All references cited and discussed in this specification are incorporated herein by reference in their entireties and to the same extent as if each reference was individually incorporated by reference. In terms of notation, hereinafter, "[n]" represents the nth reference cited in the reference list. For example, [7] represents the 7th reference cited in the reference list, namely, L. J. Cote, F. Kim, J. X. Huang, *J. Am. Chem. Soc.* 2009, 131, 1043.

FIELD OF THE INVENTION

The invention generally relates to materials for composite and electronics applications, and more specifically, to water processable graphene oxide:single walled carbon nanotube composite, and relevant applications of the same, such as an anode modifier for polymer solar cells.

BACKGROUND OF THE INVENTION

The development of affordable photovoltaic technologies, i.e., solar cells, offers one of the promising solutions for clean, renewable energy. Solution-processed polymer photovoltaic cells have attracted much attention since they can be manufactured with inexpensive, high-throughput techniques [1]. They are light weight and can also be flexible, making it possible to integrate them with ordinary surfaces at a large scale to provide inexpensive power sources. They can also be customized to serve as cheap, disposable, soft generators for remote, autonomous micro devices. With a rapid progress in both materials design and device architectures, it is envisioned that polymer photovoltaic system with power conversion efficiency (PCE) over 10% can be realized [2].

In a typical polymer solar cell, the transparent anode, e.g., indium tin oxide (ITO), is usually coated with a modifying layer that can block electrons but help to transport holes to minimize carrier recombination. Among the successful hole transporting layer materials, the conjugated polymer poly (3,4-ethylenedioxythiophene):poly(styrenesulfonate) (PEDOT:PSS) has been predominantly used as an anode modifier due to its exceptional solution processability [1]. Li et al. first reported that graphene oxide (GO) can also be used as a hole transporting layer on ITO for polymer solar cells, potentially replacing PEDOT:PSS [3]. GO is a graphene derivative decorated with oxygen-containing groups such as carboxylic acids, epoxides and hydroxides that can be readily synthesized by oxidative exfoliation of graphite powders to yield stable aqueous dispersion of single layer sheets [4-6]. The apparent thickness of a GO sheet was measured to be around 1 nm by atomic force microcopy (AFM) but its lateral dimension can readily extend to tens of microns [7, 8]. The large band gap of GO helps block electron flows towards the anode, thus effectively suppressing the carrier recombination [3, 9]. The performance of the GO hole transporting layer was demonstrated to be comparable to PEDOT:PSS. However, since GO is insulating, it also increases the internal resistance of the device, which could lower the fill factor unless its thickness can be kept at the minimum, ideally down to one monolayer. An earlier work of the inventors has shown that GO pieces can be tiled up by Langmuir-Blodgett assembly to obtain high coverage monolayers [7, 10]. Since spin coating is routinely used for fabricating polymer solar cells, it would be a more desirable method if very thin GO modifying layers can be made. Li et al. used spin coating to make the GO modifying layers on ITO surface and found that only when the thickness of the GO films was reduced to around 2 nm, were their performances comparable to PEDOT:PSS [3]. However, spin coating such thin GO films (i.e., one to two monolayers) can be extremely challenging because the resulting films also need to fully coverage the underlying surface.

Therefore, a heretofore unaddressed need exists in the art to address the aforementioned deficiencies and inadequacies.

SUMMARY OF THE INVENTION

In one aspect, the invention relates to a method of forming a GO based layer. In one embodiment, the method includes the steps of preparing a solution of GO; preparing a solution of nanostructures; and applying the solution of GO and the solution of nanostructures onto a surface of a substrate to form a GO based layer with the plurality of nanostructures. The mass ratio of the GO and the nanostructures in the GO based layer is in a range of about 1:0.01 w/w to 1:0.8 w/w.

In one embodiment, the substrate is an ITO layer.

The nanostructures include carbon nanotubes, or nanofibers, where the nanostructures are functionalized with carboxylic acid. In one embodiment, the carbon nanotubes include single walled carbon nanotubes (SWCNTs) or multi-walled carbon nanotubes (MWCNTs).

In one embodiment, the step of preparing the solution of GO is performed by dispersing the GO in deionized water.

In one embodiment, the step of preparing the solution of nanostructures comprises the steps of dispersing the nanostructures in water to form a mixture thereof; ultrasonicating the mixture for a first period of time; and centrifugating the ultrasonicated mixture at a predetermined speed for a second period of time, where the first period of time is about 2 hours, the second period of time is about 1 hours, and the predetermined speed is about 11,000 rpm.

In one embodiment, the step of applying the solution of GO and the solution of nanostructures onto the surface of the substrate comprises the steps of mixing the solution of GO and the solution of nanostructures to form a dispersion of the GO and the nanostructures; spin coating the GO and nanostructures dispersion on the surface of the substrate to form a spin coated film of the GO and nanostructures dispersion thereon; and thermally annealing the spin coated film to form the GO based layer.

In another aspect, the invention relates to a method of forming a GO based layer. In one embodiment, the method includes the steps of preparing a dispersion of GO and nanostructures, and spin coating the dispersion on a surface of a substrate to form a spin coated film thereon; and thermally annealing the spin coated film to form the GO based layer. The mass ratio of the GO and the nanostructures in the GO based layer is in a range of about 1:0.01 w/w to 1:0.8 w/w.

In one embodiment, the nanostructures include carbon nanotubes, or nanofibers, where the nanostructures are functionalized with carboxylic acid. In one embodiment, the carbon nanotubes include SWCNTs or MWCNTs.

In one embodiment, the step of preparing the dispersion of GO and nanostructures comprises the steps of mixing the GO and the nanostructures in water to form a mixture thereof; and ultrasonicating the mixture to form the dispersion of GO and nanostructures.

In one embodiment, the substrate is an ITO layer.

In yet another aspect, the invention relates to an article of manufacture including a substrate having a surface; and a composite layer of GO and nanostructures formed on the surface of the substrate. In one embodiment, the nanostructures include carbon nanotubes, or nanofibers, where the nanostructures are functionalized with carboxylic acid. In one embodiment, the carbon nanotubes include SWCNTs or MWCNTs. In one embodiment, the mass ratio of the GO and the nanostructures in the GO based layer is in a range of about 1:0.01 w/w to 1:0.8 w/w.

In one embodiment, the article of manufacture is a solar cell, wherein the substrate is an ITO layer. The ITO layer is pre-patterned, such that the pre-patterned ITO layer and the composite layer form an anode. In one embodiment, the solar cell further comprises an active layer formed on the GO and nanostructure composite layer; and a cathode formed on active layer.

In a further aspect, the invention relates to an article of manufacture including a composite of GO and nanostructures, where a mass ratio of the GO and the nanostructures in the composite is in a range of about 1:0.01 w/w to 1:0.8 w/w.

In one embodiment, the nanostructures include carbon nanotubes, or nanofibers, where the nanostructures are functionalized with carboxylic acid. In one embodiment, the carbon nanotubes include SWCNTs or MWCNTs.

These and other aspects of the present invention will become apparent from the following description of the preferred embodiment taken in conjunction with the following drawings, although variations and modifications therein may be affected without departing from the spirit and scope of the novel concepts of the disclosure.

BRIEF DESCRIPTION OF THE DRAWINGS

The accompanying drawings illustrate one or more embodiments of the invention and together with the written description, serve to explain the principles of the invention. Wherever possible, the same reference numbers are used throughout the drawings to refer to the same or like elements of an embodiment.

DETAILED DESCRIPTION OF THE INVENTION

Figure 1:
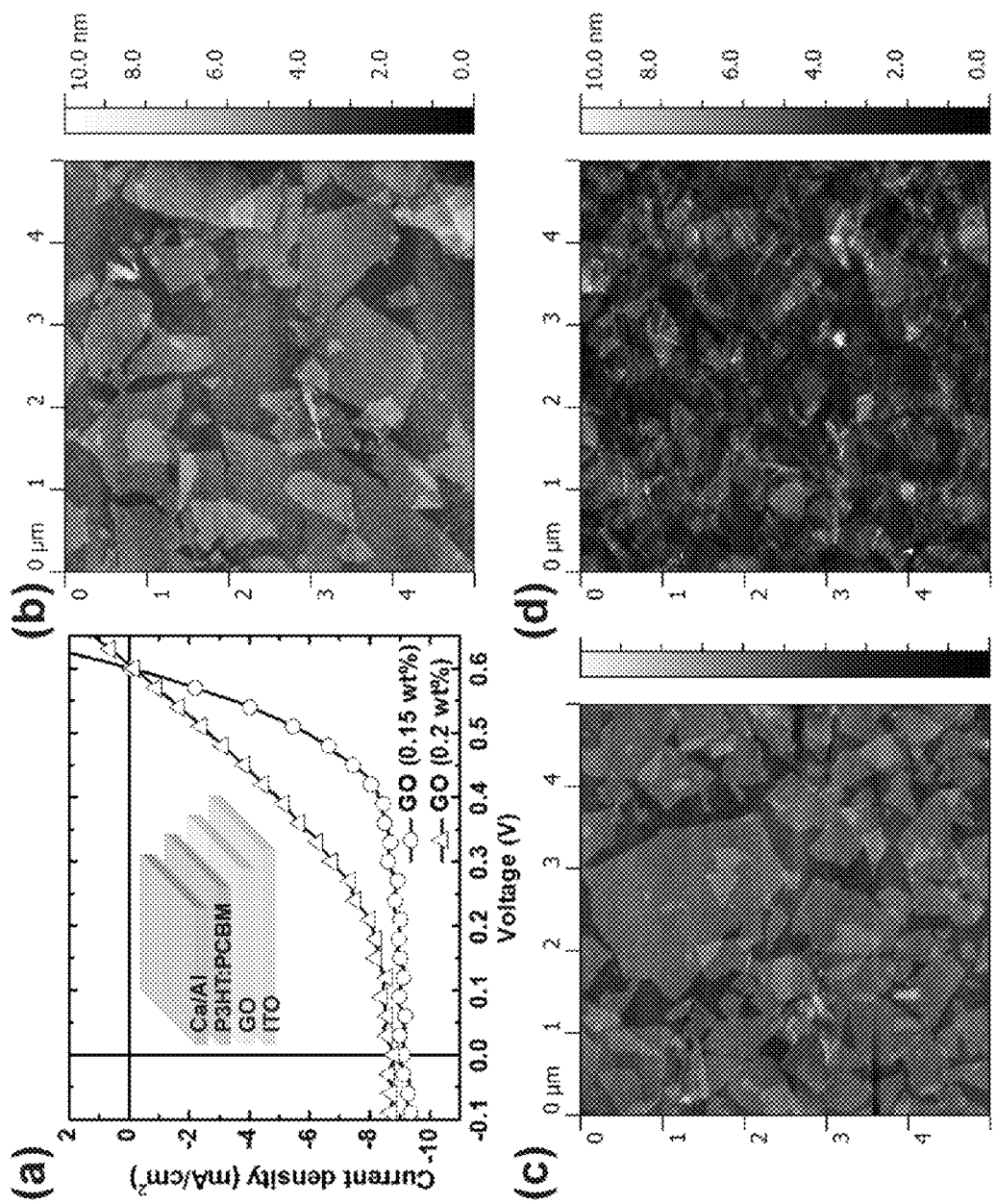
FIG. 1 shows (a) current density-voltage characteristics of P3HT:PCBM solar cells with GO as the hole transporting layer (inset). A small change in the processing condition of GO can significantly and indeed, unexpectedly, affect the performance of the devices. (b)-(d) AFM images of GO thin films deposited on $SiO_2$/Si substrates. As the concentration of the starting dispersion increases from (b) about 0.1 wt % to (c) about 0.15 wt %, the surface coverage of the resulting films greatly improves, leading to more reproducible devices (a, open circle). (d) about 0.2 wt % dispersion can produce thin films with near full coverage, but the increase in GO thickness from (c) about 1 nm to (d) about 3-4 nm resulted in substantial decrease in device performance (a, open triangle).
Figure 2:
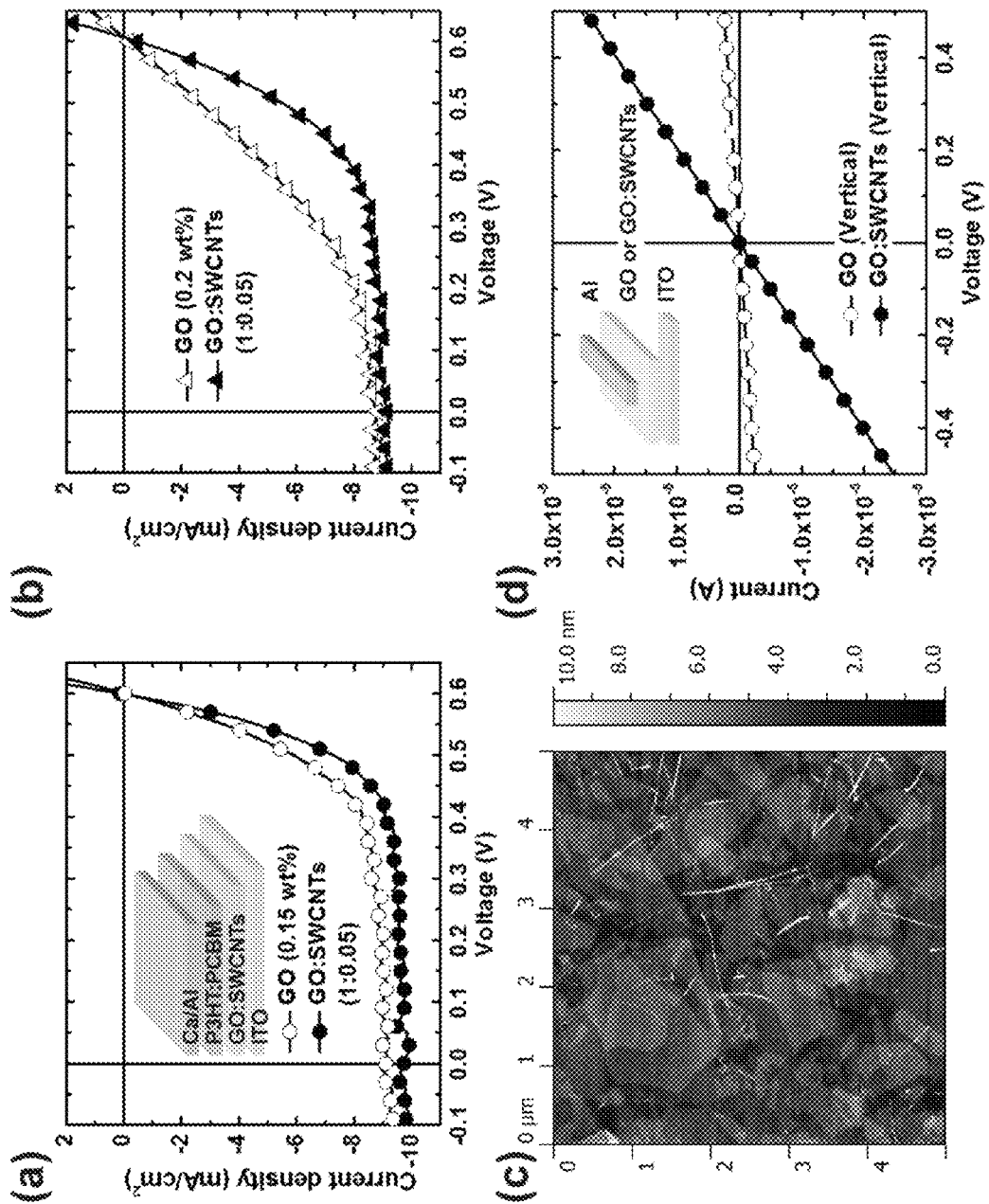
FIG. 2 shows addition of a small amount of SWCNTs into GO (GO:SWCNTs=1:0.05, w/w) can increase, even prominently, the FF and $J_{SC}$ in devices fabricated with GO modifiers prepared from (a) about 0.15 wt % and (b) about 0.2 wt % dispersion. Note that the improvement is more pronounced with the thicker GO film (b). (c) AFM image of the GO:SWCNTs layer, showing very low surface roughness (root mean square roughness=0.962 nm). (d) The vertical resistance of the GO film was decreased by an order of magnitude after adding SWCNTs, leading to decreased serial resistance in the final device and increased FF.

The present invention will now be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

The terms used in this specification generally have their ordinary meanings in the art, within the context of the invention, and in the specific context where each term is used. Certain terms that are used to describe the invention are discussed below, or elsewhere in the specification, to provide additional guidance to the practitioner regarding the description of the invention. For convenience, certain terms may be highlighted, for example using italics and/or quotation marks. The use of highlighting has no influence on the scope and meaning of a term; the scope and meaning of a term is the same, in the same context, whether or not it is highlighted. It will be appreciated that same thing can be said in more than one way. Consequently, alternative language and synonyms may be used for any one or more of the terms discussed herein, nor is any special significance to be placed upon whether or not a term is elaborated or discussed herein. Synonyms for certain terms are provided. A recital of one or more synonyms does not exclude the use of other synonyms. The use of examples anywhere in this specification including examples of any terms discussed herein is illustrative only, and in no way limits the scope and meaning of the invention or of any exemplified term. Likewise, the invention is not limited to various embodiments given in this specification.

It will be understood that, as used in the description herein and throughout the claims that follow, the meaning of "a", "an", and "the" includes plural reference unless the context clearly dictates otherwise. Also, it will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

It will be further understood that the terms "comprises" and/or "comprising," or "includes" and/or "including" or "has" and/or "having" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, the terms "comprising," "including," "carrying," "having," "containing," "involving," and the like are to be understood to be open-ended, i.e., to mean including but not limited to.

As used herein, a "nanostructure" refers to an object of intermediate size between molecular and microscopic (micrometer-sized) structures. In describing nanostructures, the sizes of the nanostructures refer to the number of dimensions on the nanoscale. For example, nanotextured surfaces have one dimension on the nanoscale, i.e., only the thickness of the surface of an object is between 0.1 and 1000 nm. Nanotubes have two dimensions on the nanoscale, i.e., the diameter of the tube is between 0.1 and 1000 nm; its length could be much greater. Finally, sphere-like nanoparticles have three dimensions on the nanoscale, i.e., the particle is between 0.1 and 1000 nm in each spatial dimension. A list of nanostructures includes, but not limited to, nanoparticle, nanocomposite, quantum dot, nanofilm, nanoshell, nanofiber, nanoring, nanorod, nanotube, and so on.

As used herein, if any, the term "atomic force microscopy" or its abbreviation "AFM" refers to a very high-resolution type of scanning probe microscopy, with demonstrated resolution on the order of fractions of a nanometer, more than 1000 times better than the optical diffraction limit.

As used herein, if any, the term "scanning electron microscope" or its abbreviation "SEM" refers to a type of electron microscope that images the sample surface by scanning it with a high-energy beam of electrons in a raster scan pattern. The electrons interact with the atoms that make up the sample producing signals that contain information about the sample's surface topography, composition and other properties such as electrical conductivity.

As used herein, if any, the term "X-ray photoelectron spectroscopy" or its abbreviation "XPS" refers to a method used to determine the composition of the top few nanometers of a surface. It involves irradiating a material with a beam of X-rays while simultaneously measuring the kinetic energy and number of electrons that escape from the top 1 to 10 nm of the material being analyzed.

The description will be made as to the embodiments of the present invention in conjunction with the accompanying drawings in FIGS. 1-5. In accordance with the purposes of this disclosure, as embodied and broadly described herein, this disclosure, in one aspect, relates to an article of manufacture having a composite of GO and nanostructures such as SWCNTs, methods of making and applications of the same.

The nanostructures include carbon nanotubes, or nanofibers. The carbon nanotubes include SWCNTs or MWCNTs. In one embodiment, the nanostructures are functionalized with carboxylic acid, or the likes. According to the invention, a mass ratio of the GO and the nanostructures in the GO composite is in a range of about 1:0.01 w/w to 1:0.8 w/w.

Figure 5:
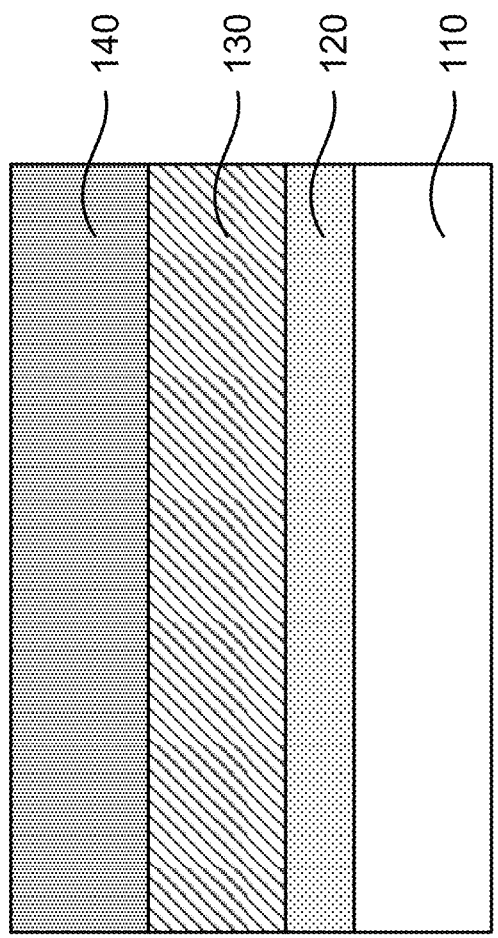
FIG. 5 shows schematically a cross-sectional view of a photovoltaic device according to one embodiment of the invention.

In one embodiment, the article of manufacture is a solar cell, as shown in FIG. 5, where the composite of GO and nanostructures is spin coated on a surface of a substrate 110 to form a GO and nanostructure composite layer 120 thereon. The substrate 110 is an ITO layer. The ITO layer can be pre-patterned (not shown). The ITO layer 110 and the composite layer 120 form an anode of the solar cell 100. The solar cell 100 also has an active layer 130 formed on the GO and nanostructure composite layer 120, and a cathode 140 formed on active layer 130.

According to the invention, adding a small amount of nanostructures, such as single walled carbon nanotubes (SWCNTs), in a GO modifying layer/film can significantly improve the devices' fill factor (FF). As discussed below, polymer solar cells fabricated with an optimized GO:SW-CNTs composite layer/film show comparable or even a bit higher performance compared to the devices using PEDOT:PSS as the hole transporting layer. Allowing thicker GO films to be used as the hole transporting layer can greatly facilitate the integration of GO into polymer photovoltaic devices.

In another aspect of the invention, a method of forming a GO based layer includes preparing a solution of GO; preparing a solution of nanostructures; and applying the solution of GO and the solution of nanostructures onto a surface of a substrate to form a GO based layer with the plurality of nanostructures. The mass ratio of the GO and the nanostructures in the GO based layer is in a range of about 1:0.01 w/w to 1:0.8 w/w.

The nanostructures include carbon nanotubes, or nanofibers, where the nanostructures are functionalized with carboxylic acid. In one embodiment, the carbon nanotubes include SWCNTs or MWCNTs.

In one embodiment, the step of preparing the solution of GO is performed by dispersing the GO in deionized water.

In one embodiment, the step of preparing the solution of nanostructures comprises the steps of dispersing the nanostructures in water to form a mixture thereof; ultrasonicating the mixture for a first period of time; and centrifugating the ultrasonicated mixture at a predetermined speed for a second period of time, where the first period of time is about 2 hours, the second period of time is about 1 hours, and the predetermined speed is about 11,000 rpm.

In one embodiment, the step of applying the solution of GO and the solution of nanostructures onto the surface of the substrate comprises the steps of mixing the solution of GO and the solution of nanostructures to form a dispersion of the GO and the nanostructures; spin coating the GO and nanostructures dispersion on the surface of the substrate to form a spin coated film of the GO and nanostructures dispersion thereon; and thermally annealing the spin coated film to form the GO based layer.

In a further aspect of the invention, a method of forming a GO based layer includes the steps of preparing a dispersion of GO and nanostructures, and spin coating the dispersion on a surface of a substrate to form a spin coated film thereon; and thermally annealing the spin coated film to form the GO based layer. The mass ratio of the GO and the nanostructures in the GO based layer is in a range of about 1:0.01 w/w to 1:0.8 w/w.

In one embodiment, the step of preparing the dispersion of GO and nanostructures comprises the steps of mixing the GO and the nanostructures in water to form a mixture thereof; and ultrasonicating the mixture to form the dispersion of GO and nanostructures.

In one embodiment, the nanostructures include carbon nanotubes, or nanofibers, where the nanostructures are functionalized with carboxylic acid. In one embodiment, the carbon nanotubes include SWCNTs or MWCNTs.

Without intent to limit the scope of the invention, further exemplary processes and their related results according to the embodiments of the present invention are given below.

Materials:

GO was synthesized by a modified Hummers' method [23] and purified by a two-step washing method as reported elsewhere [22]. The purified GO, with typical lateral size of a few microns, was dried and redispersed in deionized water to create dispersions. SWCNTs were purchased from Carbon Solutions, Inc., (P3-SWNT, functionalized with about 1.0-3.0 atomic % carboxylic acid) and dispersed in water (1 mg/ml) by ultrasonication (Misonix, S-4000) for about 2 hours, followed by centrifugation at about 11,000 rpm for about 1 hour (Eppendorf, 5417C) to collect the supernatant for later use. PEDOT:PSS (Clevios 4083, H. C. Starck), 1,2-dichlorobenzene (anhydrous, Sigma-Aldrich), P3HT (4002-EE, Rieke Metals, Inc.), and PCBM (>99.5%, Sigma-Aldrich) were used as received.

Device Fabrication:

GO:SWCNTs dispersions were spin coated on pre-patterned ITO anodes (about 20 Ω/sq) at about 2,000 rpm for about 40 seconds, followed by thermal annealing at about 120° C. for about 20 minutes. For control devices, PEDOT:PSS was spin coated at about 4,000 rpm for about 1 minute, followed by thermal annealing at about 150° C. for about 30 minutes. The modified substrates were then transferred into a nitrogen-filled glove box, and about 2 wt % P3HT:PCBM (1:1, w/w) in 1,2-dichlorobenzene was spin cast at about 600 rpm for about 40 seconds. The active layers were then solvent-annealed by a slow-growth method for about 30 minutes [24]. Finally, Ca/Al (about 20/60 nm) electrodes were thermally evaporated to complete the devices.

Characterizations:

Two-terminal measurements were performed by using a Keithley 2400 source meter. Photovoltaic measurements were done by illuminating devices (device area=about 0.04 cm$^2$) using an Oriel Xe solar simulator (AM 1.5G simulated spectrum) equipped with an Oriel 130 monochromator. Filters were used to cut off grating overtones. A calibrated silicon reference solar cell with a KG5 filter certified by the National Renewable Energy Laboratory was used to confirm the measurement conditions. At least 25 devices were fabricated for each condition. To minimize the uncertainty with the fabrication processes, the best 15 devices were used to calculate the average values of photovoltaic parameters. The current density-voltage plot of a device that shows closest performance to the average was chosen to represent the group in the figures. Modifying layers deposited on the ITO were imaged by SEM (Hitachi FE-SEM 54800) to examine their overall coverage and uniformity. Due to the higher roughness of the ITO surface (c.a. 10 nm), the microstructure of the GO and GO:SWCNTs thin films were examined by AFM (Veeco, Multimode V) on samples deposited on smoother SiO$_2$/Si substrates. Under the same processing conditions, the GO thin films deposited on SiO$_2$/Si and ITO showed very similar overall coverage and thickness. The transmittance was measured with a UV/vis spectrometer (Agilent Technologies, 8653).

First, the effects of solution processing conditions for spin coating GO thin films on the device performance were investigated, where the prototypical poly(3-hexylthiophene):[6,6]-phenyl C$_{61}$ butyric acid methyl ester (P3HT:PCBM) bulk heterojunction devices [2] was chosen as the model system since they have been extensively studied and developed to a relatively more mature stage. In a device fabrication process, an aqueous GO stock dispersion was diluted to various concentrations and spin coated on pre-patterned ITO substrates at about 2,000 rpm. Then a P3HT:PCBM active layer was deposited on the top of the modified ITO substrate, followed by solvent annealing and vacuum deposition of Ca and Al to complete the device, as shown in inset of FIG. 1(a). Although the relationship between the GO layer thickness and the device performance was already discussed in Li's paper [3], the processing conditions of the GO modifying layer, e.g., dispersion concentration and spin-coating parameters, were not provided. These processing conditions are crucial to the device performance. A small variation in the concentrations of the GO dispersion from about 0.1 wt % to about 0.2 wt % can result in large variations in thin film coverage and thickness, thus greatly affecting the device performance. Below about 0.15 wt %, the GO dispersion yielded non-uniform, incomplete coverage of GO pieces, as shown in an AFM image in FIG. 1(b). Such films were found to produce poor and irreproducible device performances. With about 0.15 wt % GO dispersion, it started to yield nearly complete coverage of GO, as shown in FIG. 1(c), leading to reproducible photovoltaic results, as shown in FIG. 1(a) (open circle). The open-circuit voltage ($V_{OC}$), short-circuit current density ($J_{SC}$), FF, and PCE of the devices were measured to be about 0.60 V, about 9.3±0.73 mA cm$^{-2}$, about 60.1±3.5%, and about 3.28±0.14%, respectively. A slight increase of the GO concentration to about 0.2 wt % yielded thicker GO thin films (c.a. 3-4 nm) including stacked multilayers, as shown in FIG. 1(d). The corresponding $J_{SC}$, FF, and PCE of the devices decreased to about 9.05±0.67 mA cm$^{-2}$, about 43.9±4.8%, and about 2.36±0.28%, respectively, while the $V_{OC}$ remained the same, as shown in FIG. 1(a) (open triangle). The decrease in $J_{SC}$ and FF is attributed to increased vertical resistance with the thicker insulating GO film. This shows that the processing conditions of GO have to be limited to a very narrow window to ensure both near complete coverage and near monolayer thickness for achieving a high device performance. This can be very challenging due to the sheet-like morphology of GO, and its tendency to wrinkle and overlap under capillary forces [10, 11].

Since it is much easier to achieve a complete coverage of GO with larger thickness, if thicker films can be made more conductive along the thickness direction, they could work more reliably as the modifying layer. Although GO can be deoxygenated to greatly increase its conductivity, the reduction process also alters its work function, making it unsuitable as a hole transporting layer [12, 13]. Incorporating a more conductive material such as SWCNTs in GO could solve the problem. The small diameter of SWCNTs (c.a. 1 nm) makes them particularly attractive as an adduct for GO thin films because it would not significantly increase the surface roughness if they can be well dispersed. An earlier work by the inventors discovered that GO can function as a surfactant to disperse unfunctionalized SWCNTs in water [14, 15]. Meanwhile, the SWCNTs also help to create more uniform GO thin films by stitching GO sheets through π-π stacking [16]. The synergistic co-assembly between GO and unfunctionalized SWCNTs can be explored to create hybrid thin films. According to the invention disclosed below, the functionalized SWCNTs are utilized. The water dispersible, surface functionalized SWCNTs are sufficiently conductive to improve GO's performance as an anode modifier. Such SWCNTs are functionalized with about 1.0-3.0 atomic % of carboxylic acid groups, and can be readily mixed with GO to yield a uniform GO:SWCNTs composite thin film by spin coating, which is favorable for material processing in fabricating polymer solar cells.

The GO:SWCNTs dispersions were created by direct mixing of the two components in water by sonication. Surprisingly, incorporating a small amount of SWCNTs (GO:SWCNTs=1:0.05, w/w) into the GO modifying layer, as shown in inset of FIG. 2(a), resulted in, unexpectedly, considerable improvement for devices made with both thin GO modifying layers with about 0.15 wt % GO, as shown in FIG. 2(a), ($J_{SC}$=9.79±0.43 mA cm$^{-2}$, FF=62.7±2.1%, PCE=3.66±0.18%) and thick GO modifying layers with about 0.2 wt % GO, as shown in FIG. 2(b), ($J_{SC}$=9.19±0.48 mA cm$^2$, FF=56.4±2.3%, PCE=3.13±0.11%). An AFM observation of the GO:SWCNTs thin films, as shown in FIG. 2(c), shows that the overall thickness is largely unchanged after the incorporation of SWCNTs. The GO:SWCNTs thin films also have very low surface roughness (root mean square roughness=0.962 nm for FIG. 2(c)), which is crucial for depositing smooth sequential layers to avoid shorting. The AFM image also shows that the amount of the incorporated SWCNTs (GO:SCNWTs=1:0.05, w/w) was below the percolation threshold. Indeed, it was found that adding this amount of SWCNTs does not improve the lateral conductivity GO thin films. However, the presence of the SWCNTs was found to greatly improve the vertical conductivity of the GO layer, which is more relevant to the charge flow in the thin film photovoltaic devices. The inset of FIG. 2(d) shows the geometry of the current-voltage measurement of the GO:SWCNTs thin film sandwiched between Al and ITO electrodes. As shown in FIG. 2(d), the vertical resistance of the GO layer (open circle) was reduced by an order of magnitude after adding SWCNTs (solid circle). This leads to lower overall serial resistance of the entire cell, thus improving FF and $J_{SC}$. In addition, adding SWCNTs greatly reduces the sensitivity of the device performance on the thickness of the GO modifying layer. For example, without SWCNTs, the PCEs of the cells decreased from about 3.28±0.14% to about 2.36±0.28% when the thickness of GO increased from around about 1 nm (spin coated from about 0.15 wt % GO dispersion) to around about 3-4 nm (spin coated from about 0.2 wt % GO dispersion), respectively. However, after adding SWCNTs, the difference between the PCEs of the two types of cells (about 3.66±0.18% and about 3.13±0.11%, respectively) became much smaller. Overall, adding SWCNTs leads to improved and more reproducible performances of GO modifying layers that are also less sensitive to the solution processing parameters.

According to the invention, with water processability of both GO and the functionalized SWCNTs, it is convenient to tune their relative fraction in the dispersion and thus in the final thin films, too. Table 1 below summarizes the effects of SWCNT concentration in the dispersion on the device performances.

TABLE 1

Effects of GO:SWCNTs mass ratio on device performances

| | $V_{OC}$ [V] | $J_{SC}$ [mA cm$^{-2}$] | FF [%] | PCE [%] |
|---|---|---|---|---|
| GO[a] | 0.60 | 9.30 ± 0.73 | 60.1 ± 3.5 | 3.28 ± 0.14 |
| GO:SWCNTs (1:0.05) | 0.60 | 9.79 ± 0.43 | 62.7 ± 2.1 | 3.66 ± 0.18 |
| GO:SWCNTs (1:0.1) | 0.60 | 10.43 ± 0.40 | 61.4 ± 2.2 | 3.80 ± 0.08 |

TABLE 1-continued

Effects of GO:SWCNTs mass ratio on device performances

|  | $V_{OC}$ [V] | $J_{SC}$ [mA cm$^{-2}$] | FF [%] | PCE [%] |
|---|---|---|---|---|
| GO:SWCNTs (1:0.2) | 0.60 | 10.82 ± 0.56 | 62.8 ± 3.1 | 4.10 ± 0.18 |
| GO:SWCNTs (1:0.5) | 0.58 | 9.93 ± 0.64 | 58.8 ± 1.2 | 3.53 ± 0.17 |

$^{a)}$Prepared from about 0.15 wt % dispersion in water.

Figure 3:
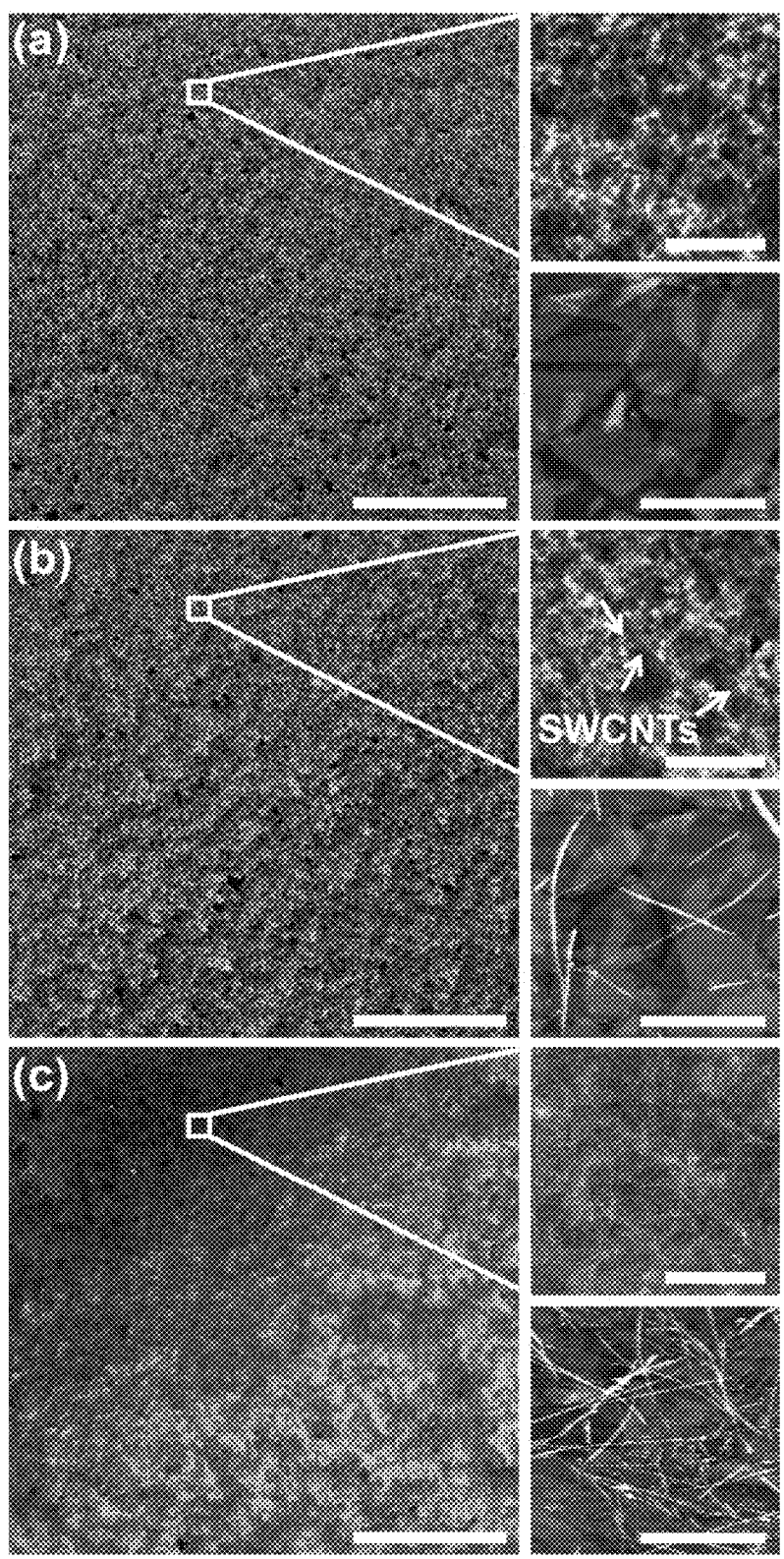
FIG. 3 shows SEM images of thin films deposited on ITO spin coated from (a) GO (about 0.15 wt %), (b) about 1:0.2 GO:SWCNTs and (c) about 1:0.5 GO:SWCNTs dispersions. Scale bars=30 µm. The upper right panels are magnified SEM views of local areas (scale bars=2 µm), and the lower right panels are AFM images of films deposited on $SiO_2$/Si, revealing greater details (scale bars=1 µm). Adding excessive amount of SWCNTs (e.g., GO:SWCNTs=1:0.5, w/w) can adversely affect the uniformity and coverage of GO due to the formation of local SWCNT networks (c, lower right).

The GO concentration was kept at about 0.15 wt % to achieve an optimized PCE. The improvement in FF appeared to be already saturated after adding about 1:0.05 of SWCNTs into the GO layer. However, with thicker GO layers, continued improvements in FF are achieved with higher SWCNTs contents. As the SWCNT concentration was increased from about 1:0.05 to about 1:0.2, the $V_{OC}$ of the cells remained unchanged, while $J_{SC}$ continued to increase, leading to improved PCE values. The initial improvement of $J_{SC}$ is attributed to reduced vertical resistance by adding SWCNTs, however, further improvement of $J_{SC}$ is attributed to improved hole extraction from the polymer since the SWCNTs added to the near monolayer thick GO thin film were likely in contact with the active layer as well [17]. With about 1:0.2 GO:SWCNTs mass ratio, the device PCE reached about 4.10±0.18%, which represents an about 25% improvement over devices without SWCNTs. However, when the SWCNT concentration was further increased to about 1:0.5 mass ratio, all photovoltaic parameters, including $V_{OC}$, dropped to lower values. FIG. 3 shows the morphological evolution of the GO:SWCNTs thin films with increased nanotube content revealed by AFM and scanning electron microscopy (SEM). SEM images (FIGS. 3(a) and 3(b), left and upper right panels) show that adding SWCNTs at about 1:0.2 mass ratio does not affect the overall coverage and uniformity of the GO layer. The SWCNTs can be seen to be evenly dispersed throughout the GO layer (FIG. 3(b), AFM, lower right panel). However, with excessive amount of SWCNTs (about 1:0.5 mass ratio), the GO:SWCNTs films become non-uniform with islands of multilayer GO:SWCNTs stacks as well as uncovered areas, as shown in FIG. 3(c). The AFM image reveals that at this concentration, the SWCNTs form network-like aggregates, trapping thicker piles of GO pieces. Uneven coverage and thickness of modifying layers at high SWCNT content are responsible for their lower performance.

Figure 4:
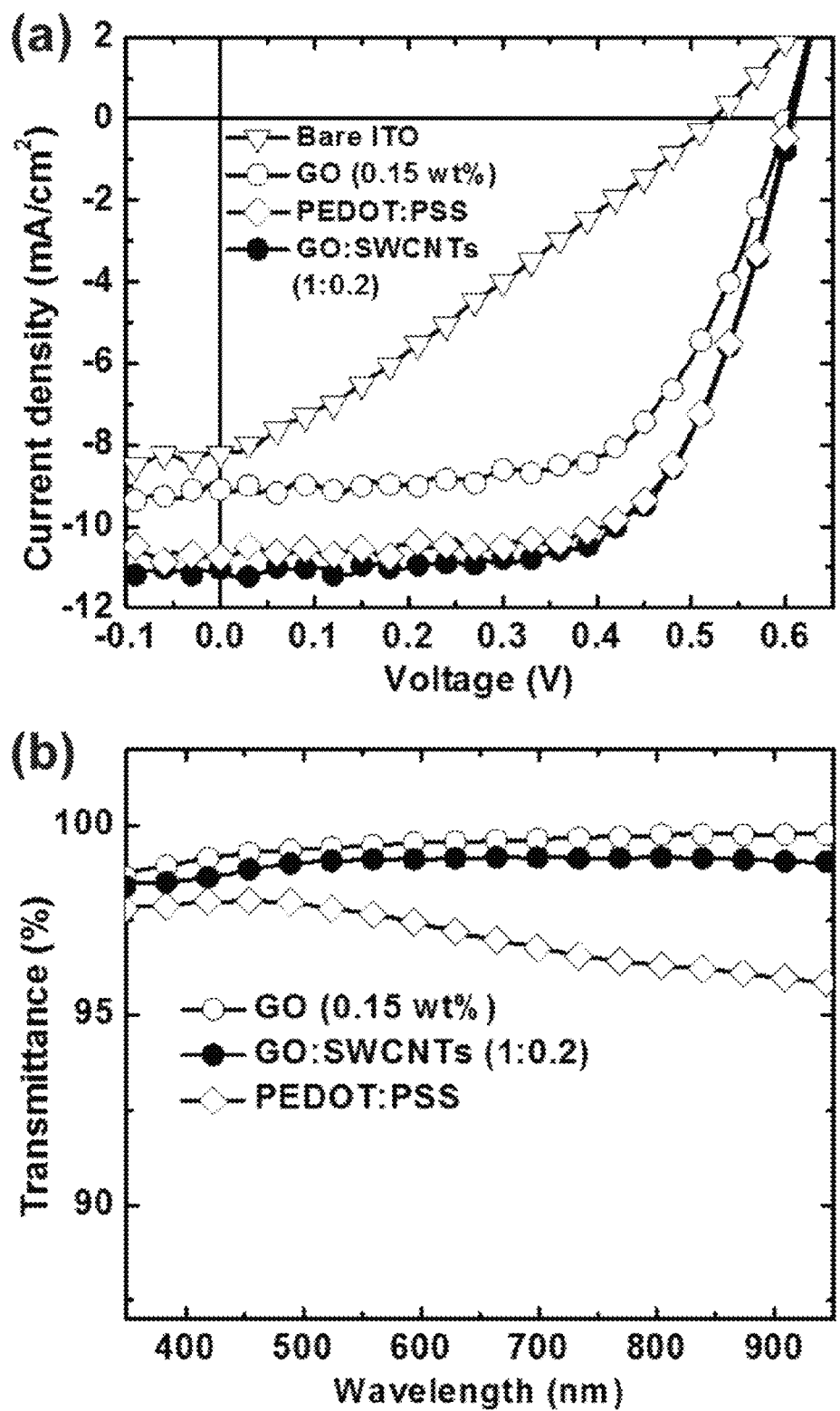
FIG. 4 shows (a) current density-voltage characteristics of devices made on unmodified ITO (inverted triangle), with GO layer (open circle, spin coated from about 0.15 wt % dispersion), PEDOT:PSS layer (diamond), and GO:SWCNT layer (solid circle, spin coated from 0.15 wt % GO dispersion, GO:SWCNTs=1:0.2, w/w). Devices with the GO:SWCNTs modifying layer show comparable or even slightly better performance compared to the best PEDOT:PSS devices. (b) Optical transmittance of the GO, GO:SWCNTs and PEDOT:PSS modifying layers showing greater transparency of GO based films in the longer wavelengths.

FIG. 4(a) shows the current density-voltage characteristics of solar cells made with ITO modified by GO:SWCNTs (about 1:0.2 mass ratio, spin coated from about 0.15 wt % GO dispersion), GO only (spin coated from about 0.15 wt % GO dispersion), PEDOT:PSS, and an unmodified ITO anode. In general, as shown in FIG. 4, the PEDOT:PSS devices (open diamond) consistently show higher $J_{SC}$ and FF values than the devices with only GO as modifier (open circle) and those without modifying layers (open inversed triangle). However, the GO:SWCNTs devices (solid circle) have even a bit higher $J_{SC}$ and comparable FF, leading to comparable or even slightly higher PCE values. A potential advantage of using GO based anode modifying layer is its high transparency in the red to near infrared region of the solar spectrum, as shown in FIG. 4(b), which allows more absorption by the active layer. The absorption of the active layer P3HT:PCBM is insignificant in the red to near infrared, which makes it an unsuitable system to fully explore this advantage. If GO based modifying layers are shown to be compatible with low band gap polymer systems [18], their performances even surpass PEDOT:PSS.

In summary, according to the invention, the GO:SWCNTs thin films are found to be efficient anode modifying layers for polymer solar cells using P3HT:PCBM as a model system. Adding a non-percolating amount of SWCNTs into GO significantly improves its vertical conductivity, which allows the use of thicker and thus easier-to-make GO films. This helps reduce the strong dependence of the device performance on GO thickness and solution processing conditions, leading to improved and more reproducible results. The GO:SWCNTs thin films according to the invention offer comparable performances to the conventional PEDOT:PSS anode modifying layer. In addition, incorporating p-type SWCNTs into GO may further promote hole extraction and the charge flow in the modifying layer [19]. Since uniform GO:SWCNTs thin films with near complete coverage can be made with much smaller thickness (around a few nm) than PEDOT:PSS (typically 40 nm), and offer considerably higher optical transmission in the longer wavelengths, the GO:SWCNTs thin films are an attractive candidate as anode modifier for low band gap polymer solar cells and possibly the interconnect layer [20, 21] in tandem devices. Since GO can undergo partial deoxygenation upon gentle heating [22], further work may be needed to evaluate the long term stability of devices with GO based modifying layers.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to enable others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

REFERENCE LIST

[1] C. J. Brabec, V. Dyakonov, U. Scherf, *Organic photovoltaics: materials, device physics, and manufacturing technologies*, Wiley-VCH, Weinheim 2008.
[2] C. J. Brabec, S. Gowrisanker, J. J. M. Halls, D. Laird, S. Jia, S. P. Williams, *Adv. Mater.* 2010, 22, 3839.
[3] S.-S. Li, K.-H. Tu, C.-C. Lin, C.-W. Chen, M. Chhowalla, *ACS Nano* 2010, 4, 3169.
[4] O. C. Compton, S. T. Nguyen, *Small* 2010, 6, 711.
[5] D. Li, R. B. Kaner, *Science* 2008, 320, 1170.
[6] S. Park, R. S. Ruoff, *Nature Nanotech.* 2009, 4, 217.
[7] L. J. Cote, F. Kim, J. X. Huang, *J. Am. Chem. Soc.* 2009, 131, 1043.
[8] S. Stankovich, D. A. Dikin, R. D. Piner, K. A. Kohlhaas, A. Kleinhammes, Y. Jia, Y. Wu, S. T. Nguyen, R. S. Ruoff, *Carbon* 2007, 45, 1558.
[9] Y. Gao, H. L. Yip, S. K. Hau, K. M. O'Malley, N.C. Cho, H. Z. Chen, A. K. Y. Jen, *Appl. Phys. Lett.* 2010, 97.
[10] L. J. Cote, J. Kim, Z. Zhang, C. Sun, J. X. Huang, *Soft Matter* 2010, 6, 6096.
[11] J. Kim, L. J. Cote, F. Kim, J. Huang, *J. Am. Chem. Soc.* 2010, 132, 260.

[12] H. J. Shin, K. K. Kim, A. Benayad, S. M. Yoon, H. K. Park, I. S. Jung, M. H. Jin, H. K. Jeong, J. M. Kim, J. Y. Choi, Y. H. Lee, *Adv. Funct. Mater.* 2009, 19, 1987.

[13] S. O. Kim, J. O. Hwang, D. H. Lee, J. Y. Kim, T. H. Han, B. H. Kim, M. Park, K. No, *J. Mater. Chem.* 2011, 21, 3432.

[14] L. J. Cote, J. Kim, V. C. Tung, J. Y. Luo, F. Kim, J. X. Huang, *Pure Appl. Chem.* 2011, 83, 95.

[15] J. Kim, L. J. Cote, F. Kim, W. Yuan, K. R. Shull, J. X. Huang, *J. Am. Chem. Soc.* 2010, 132, 8180.

[16] V. C. Tung, J.-H. Huang, I. Tevis, F. Kim, J. Kim, C.-W. Chu, S. I. Stupp, J. Huang, *J. Am. Chem. Soc.* 2011, 133, 4940.

[17] S. Chaudhary, H. Lu, A. M. Müller, C. J. Bardeen, M. Ozkan, *Nano Lett.* 2007, 7, 1973.

[18] E. Bundgaard, F. C. Krebs, *Sol. Energy Mater.* 2007, 91, 954.

[19] J. M. Lee, J. S. Park, S. H. Lee, H. Kim, S. Yoo, S. O. Kim, *Adv. Mater.* 2011, 23, 629.

[20] T. Ameri, G. Dennler, C. Lungenschmied, C. J. Brabec, *Energy Environ. Sci.* 2009, 2, 347.

[21] V. C. Tung, J. Kim, L. J. Cote, J. X. Huang, *J. Am. Chem. Soc.* 2011, 133, 9262.

[22] F. Kim, J. Luo, R. Cruz-Silva, L. C. Cote, K. Sohn, J. Huang, *Adv. Funct. Mater.* 2010, 20, 2867.

[23] W. S. Hummers, R. E. Offeman, *J. Am. Chem. Soc.* 1958, 80, 1339.

[24] G. Li, V. Shrotriya, J. Huang, Y. Yao, T. Moriarty, K. Emery, Y. Yang, *Nature Mater.* 2005, 4, 864.

What is claimed is:

1. A method of forming a graphene oxide (GO) based layer used in a photovoltaic cell, comprising the steps of:
    (a) preparing a solution of GO by dispersing the GO in deionized water;
    (b) preparing a solution of nanostructures by dispersing the nanostructures in water; and
    (c) applying the solution of GO and the solution of nanostructures onto a surface of a substrate to form a GO based layer with the plurality of nanostructures, wherein a mass ratio of the GO and the nanostructures in the GO based layer is in a range of about 1:0.01 w/w to 1:0.5 w/w.

2. The method of claim 1, wherein the substrate is an indium tin oxide (ITO) layer.

3. The method of claim 1, wherein the nanostructures comprises carbon nanotubes, or nanofibers.

4. The method of claim 3, wherein the carbon nanotubes comprise single walled carbon nanotubes (SWCNTs) or multi-walled carbon nanotubes (MWCNTs).

5. The method of claim 3, wherein the nanostructures are functionalized with about 1.0-3.0 atomic % of carboxylic acid groups.

6. The method of claim 1, wherein the step of preparing the solution of nanostructures comprises the steps of:
    ultrasonicating a mixture formed by dispersing the nanostructures in water for a first period of time; and
    centrifugating the ultrasonicated mixture at a predetermined speed for a second period of time.

7. The method of claim 6, wherein the first period of time is about 2 hours, the second period of time is about 1 hours, and the predetermined speed is about 11,000 rpm.

8. The method of claim 1, wherein the step of applying the solution of GO and the solution of nanostructures onto the surface of the substrate comprises the steps of:
    (a) mixing the solution of GO and the solution of nanostructures to form a dispersion of the GO and the nanostructures;
    (b) spin coating the GO and nanostructures dispersion on the surface of the substrate to form a spin coated film of the GO and nanostructures dispersion thereon; and
    (c) thermally annealing the spin coated film to form the GO based layer.

* * * * *